(12) United States Patent
Nakamura et al.

(10) Patent No.: US 9,826,670 B2
(45) Date of Patent: Nov. 21, 2017

(54) VEHICLE

(71) Applicants: Toru Nakamura, Toyota (JP); Shinji Ichikawa, Toyota (JP); Arinori Higashiyama, Toyota (JP); Takahisa Yamamoto, Chiryu (JP)

(72) Inventors: Toru Nakamura, Toyota (JP); Shinji Ichikawa, Toyota (JP); Arinori Higashiyama, Toyota (JP); Takahisa Yamamoto, Chiryu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 115 days.

(21) Appl. No.: 14/389,790

(22) PCT Filed: Apr. 4, 2013

(86) PCT No.: PCT/IB2013/000591
§ 371 (c)(1),
(2) Date: Oct. 1, 2014

(87) PCT Pub. No.: WO2013/150365
PCT Pub. Date: Oct. 10, 2013

(65) Prior Publication Data
US 2015/0061583 A1 Mar. 5, 2015

(30) Foreign Application Priority Data

Apr. 5, 2012 (JP) ................................. 2012-086425

(51) Int. Cl.
*H02J 7/00* (2006.01)
*H05K 9/00* (2006.01)
(Continued)

(52) U.S. Cl.
CPC .............. *H05K 9/00* (2013.01); *B60L 11/182* (2013.01); *H01F 27/36* (2013.01); *H01F 38/14* (2013.01);
(Continued)

(58) Field of Classification Search
USPC .................................................. 320/108, 109
See application file for complete search history.

(56) References Cited

U.S. PATENT DOCUMENTS 9,073,442 B2 * 7/2015 Ichikawa .............. B60L 11/123
9,126,491 B2 * 9/2015 Ichikawa .............. B60L 11/182
(Continued)

FOREIGN PATENT DOCUMENTS

DE 102006025458 A1 12/2007
JP 2010-087353 A 4/2010
(Continued)

OTHER PUBLICATIONS

Machine Translation of JP2010-070048.*
Dec. 1, 2014 Office Action issued in German Application No. DE112013001910.8.

*Primary Examiner* — Samuel Berhanu
(74) *Attorney, Agent, or Firm* — Oliff PLC

(57) ABSTRACT

A vehicle includes a power receiving portion that is mounted below a floor panel and that receives electric power in a contactless manner from a power transmitting portion provided outside the vehicle, an electromagnetic shield that prevents an electromagnetic field from passing through, a power receiving portion cover that allows the electromagnetic field to pass through and covers the power receiving portion, and an undercover that allows the electromagnetic field to pass through and covers the power receiving portion cover.

13 Claims, 9 Drawing Sheets

(51) Int. Cl.
  *B60L 11/18* (2006.01)
  *H02J 7/02* (2016.01)
  *H01F 27/36* (2006.01)
  *H01F 38/14* (2006.01)

(52) U.S. Cl.
  CPC ......... *H02J 7/025* (2013.01); *B60L 2270/147* (2013.01); *Y02T 10/7005* (2013.01); *Y02T 10/7072* (2013.01); *Y02T 90/122* (2013.01); *Y02T 90/14* (2013.01)

(56) References Cited

U.S. PATENT DOCUMENTS

| | | | |
|---|---|---|---|
| 2010/0184306 A1* | 7/2010 | Hironaka | G01R 1/0466 439/55 |
| 2011/0181240 A1* | 7/2011 | Baarman | B60L 11/182 320/108 |
| 2012/0001493 A1 | 1/2012 | Kudo et al. | |
| 2012/0318586 A1 | 12/2012 | Atarashi | |
| 2013/0026850 A1 | 1/2013 | Throngnumchai et al. | |
| 2013/0037365 A1 | 2/2013 | Ichikawa | |

FOREIGN PATENT DOCUMENTS

| | | |
|---|---|---|
| JP | A-2010-268660 | 11/2010 |
| JP | 2011-193671 A | 9/2011 |
| JP | 2011-205757 A | 10/2011 |
| JP | A-2011-204836 | 10/2011 |
| JP | 2011-229360 A | 11/2011 |
| WO | WO 2010/038326 A1 | 4/2010 |
| WO | WO 2011/108403 A1 | 9/2011 |
| WO | WO 2011/114208 A2 | 9/2011 |
| WO | WO 2011/117714 A2 | 9/2011 |

\* cited by examiner

VEHICLE

BACKGROUND OF THE INVENTION

1. Field of the Invention

The invention relates to a vehicle.

2. Description of Related Art

In recent years, hybrid vehicles and electric vehicles and the like in which the driving wheels are driven using electric power from a battery or the like are receiving a lot of attention in consideration of the environment.

In particular, in recent years, with electric vehicles provided with this kind of battery, wireless charging that enables the battery to be charged in a contactless manner without using a plug or the like is gaining attention. Recently, a variety of contactless charging methods have even been proposed.

For example, International Publication No. 2011/108403, Japanese Patent Application Publication No. 2010-268660 (JP 2010-268660 A), and Japanese Patent Application Publication No. 2011-204836 (JP 2011-204836 A) describe power transfer systems using a contactless charging method.

With these power transfer systems, a power receiving apparatus that includes a power receiving portion is mounted in a vehicle. To actually mount the power receiving portion in the vehicle, the power receiving portion is arranged below a floor panel of the vehicle. In this case, the power receiving portion must be protected from objects such as mud, rocks, and water that fly in all directions from outside the vehicle.

The patent documents above describe structures in which a power receiving apparatus that includes a power receiving portion is mounted below a floor panel of a vehicle, or near the floor panel. However, there is no mention of a specific structure for protecting the power receiving portion from objects such as mud, rocks, and water that fly in all directions from outside the vehicle.

SUMMARY OF THE INVENTION

The invention this provides a vehicle having a specific protective structure for a power receiving portion that receives electric power in a contactless manner from a power transmitting portion provided outside the vehicle, when such a power receiving portion is mounted in the vehicle.

One aspect of the invention relates to a vehicle that includes a power receiving portion that receives electric power in a contactless manner from a power transmitting portion provided outside the vehicle, an electromagnetic shield that prevents an electromagnetic field from passing through, a first cover that allows the electromagnetic field to pass through and covers the power receiving portion, and a second cover that allows the electromagnetic field to pass through and covers the first cover.

In the vehicle of one aspect of the invention, the electromagnetic shield may be provided in a position on an opposite side of the power receiving portion from the power transmitting portion side.

In the vehicle of one aspect of the invention, the power receiving portion may be mounted below a floor panel of the vehicle.

In the vehicle of one aspect of the invention, the electromagnetic shield may be open on a lower side where the power receiving portion is located, and surround the power receiving portion from above and a side in a horizontal direction, the first cover may be positioned below the power receiving portion and cover the power receiving portion, and the second cover may be positioned below the first cover and cover the first cover.

In the vehicle of one aspect of the invention, the electromagnetic shield may include a base portion positioned on the floor panel side, and a side wall portion that surrounds the base portion at an edge portion of the base portion, and extends downward from the base portion. Also, the first cover may be fixed to the electromagnetic shield so as to cover the power receiving portion, and the second cover may be fixed to the floor panel so as to cover the electromagnetic shield.

In the vehicle of one aspect of the invention, the first cover may be fixed to the base portion, in a position toward an inside, which is the power receiving portion side, of the side wall portion of the electromagnetic shield, so as to cover the power receiving portion.

In the vehicle of one aspect of the invention, the first cover may be fixed to the side wall portion of the electromagnetic shield.

In the vehicle of one aspect of the invention, the first cover may be fixed to the electromagnetic shield with a seal member disposed between the first cover and the electromagnetic shield.

In the vehicle of one aspect of the invention, the electromagnetic shield may include a base portion positioned on the floor panel side, and a side wall portion that surrounds the base portion at an edge portion of the base portion, and extends downward from the base portion. Also, the first cover portion may be fixed to the floor panel at a position on a side opposite of the side wall portion of the electromagnetic shield from the power receiving portion so that the first cover portion covers the power receiving portion, and the second cover may be fixed to the floor panel so as to cover the electromagnetic shield.

In the vehicle of one aspect of the invention, the first cover may be fixed to the floor panel with a seal member disposed between the first cover and the floor panel.

In the vehicle of one aspect of the invention, a difference between a natural frequency of the power transmitting portion and a natural frequency of the power receiving portion may be equal to or less than 10% of the natural frequency of the power receiving portion.

In the vehicle of one aspect of the invention, a coupling coefficient of the power receiving portion and the power transmitting portion may be equal to or less than 0.1.

In the vehicle of one aspect of the invention, the power receiving portion may receive electric power from the power transmitting portion through at least one of a magnetic field that is formed between the power receiving portion and the power transmitting portion and that oscillates at a specific frequency, and an electric field that is formed between the power receiving portion and the power transmitting portion and that oscillates at a specific frequency.

According to the invention, a vehicle is able to be provided that has a specific protective structure for a power receiving portion that receives electric power in a contactless manner from a power transmitting portion provided outside the vehicle, when such a power receiving portion is mounted in the vehicle.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
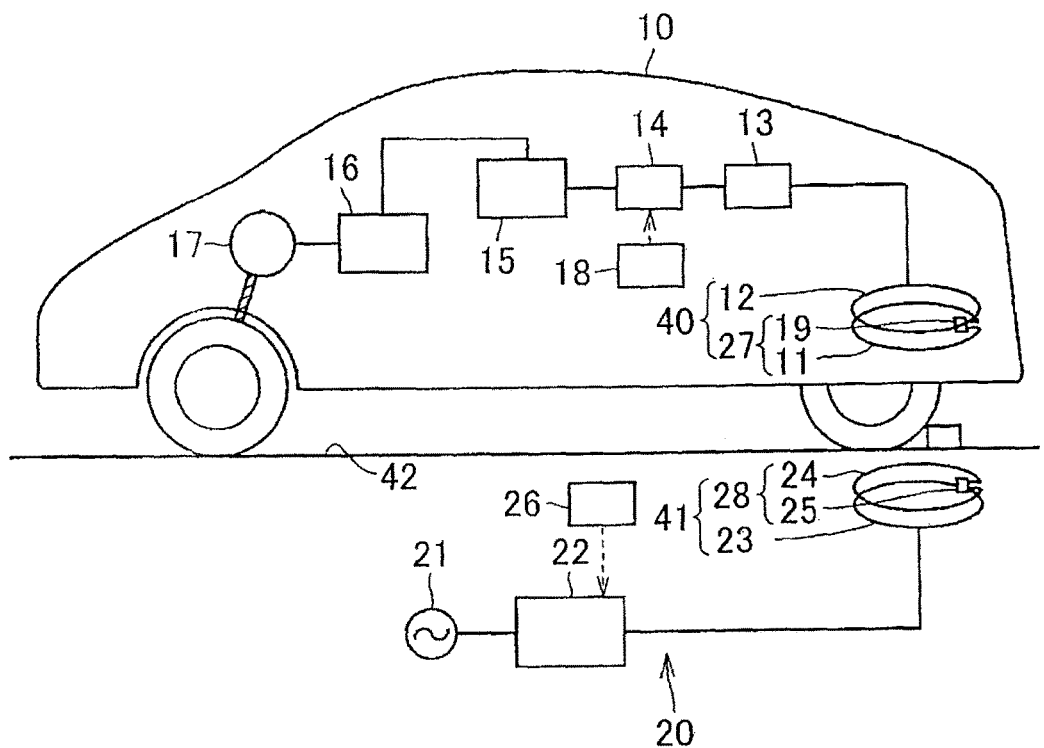
FIG. 1 is a view showing a frame format of a vehicle provided with a power transfer apparatus, a power receiving apparatus, and a power transfer system, according to one example embodiment.

A vehicle provided with a power transmitting apparatus, a power receiving apparatus, and a power transfer system according to example embodiments of the invention will hereinafter be described with reference to the accompanying drawings. Also, the scope of the invention is not necessarily limited to the numbers and amounts and the like referred to in these example embodiments unless otherwise specifically stated. Further, like parts and corresponding parts will be denoted by like reference characters and redundant descriptions may not be repeated. Also, the use of the structures in the example embodiments in appropriate combinations is initially intended.

The vehicle provided with the power transfer system according to one example embodiment will be described with reference to FIG. 1. FIG. 1 is a view showing a frame format of the vehicle provided with a power transmitting apparatus, a power receiving apparatus, and a power transfer system according to this example embodiment.

The power transfer system according to this example embodiment includes an electric vehicle 10 having a power receiving apparatus 40, and an external power supply apparatus 20 having a power transmitting apparatus 41. The power receiving apparatus 40 of the electric vehicle 10 mainly receives electric power from the power transmitting apparatus 41 when the electric vehicle 10 is stopped in a predetermined position in a parking space 42 provided with the power transmitting apparatus 41.

A chock block, or a line indicating the parking position and the parking area is provided in the parking space 42 so that the electric vehicle 10 will stop in the predetermined position.

The external power supply apparatus 20 includes an alternating current (AC) power supply 21, a high frequency power driver 22, a control portion 26, and the power transmitting apparatus 41. The high frequency power driver 22 is connected to the AC power supply 21. The control portion 26 controls the driving of the high frequency power driver 22 and the like. The power transmitting apparatus 41 is connected to the high frequency power driver 22. The power transmitting apparatus 41 includes a power transmitting portion 28 and an electromagnetic inductive coil 23. The power transmitting portion 28 includes a resonance coil 24 (also referred to as "primary coil 24"), and a capacitor 25 that is connected to this resonance coil 24. The electromagnetic inductive coil 23 is electrically connected to the high frequency power driver 22. In the example shown in FIG. 1, the capacitor 25 is provided, but the capacitor 25 may also be omitted.

The power transmitting portion 28 includes an electric circuit formed from the inductance of the resonance coil 24, the floating capacitance of the resonance coil 24, and the capacitance of the capacitor 25.

The electric vehicle 10 is provided with the power receiving apparatus 40, a rectifier 13, a DC/DC converter 14, a battery 15, a PCU (Power Control Unit) 16, a motor unit 17, and an vehicle ECU (Electronic Control Unit) 18. The rectifier 13 is connected to the power receiving apparatus 40. The DC/DC converter 14 is connected to the rectifier 13. The battery 15 is connected to the DC/DC converter 14. The motor unit 17 is connected to the PCU 16. The vehicle ECU 18 controls the driving of the DC/DC converter 14 and the PCU 16 and the like. The electric vehicle 10 according to this example embodiment is a hybrid vehicle that is provided with an engine, not shown, but the vehicle of the invention may also be an electric vehicle or a fuel cell vehicle, as long as it is driven by an electric motor.

The rectifier 13 is connected to an electromagnetic inductive coil 12. The rectifier 13 converts alternating current (AC current) supplied from the electromagnetic inductive coil 12 to direct current (DC current), which is supplied to the DC/DC converter 14.

The DC/DC converter 14 regulates the voltage of the DC current supplied from the rectifier 13, and then supplies it to the battery 15. The DC/DC converter 14 may also be omitted. In this case, the DC/DC converter 14 can be substituted out by providing a matching unit for matching the impedance to the external power supply apparatus 20 between the power transmitting apparatus 41 and the high frequency power driver 22.

The PCU 16 includes a converter that is connected to the battery 15, and an inverter that is connected to the converter. The converter regulates (i.e., steps up) the DC current supplied from the battery 15 and supplies it to the inverter. The inverter converts the DC current supplied from the converter to AC current, then supplies it to the motor unit 17.

A three-phase alternating current motor or the like may be used for the motor unit 17, for example. The motor unit 17 is driven by AC current supplied from the inverter of the PCU 16.

When the electric vehicle 10 is a hybrid vehicle, the electric vehicle 10 also includes an engine. The motor unit 17 includes a motor-generator that functions mainly as a generator, and a motor-generator that functions mainly as an electric motor.

The power receiving apparatus 40 includes a power receiving portion 27 and the electromagnetic inductive coil 12. The power receiving portion 27 includes a resonance coil 11 (also referred to as "secondary coil 11") and a capacitor 19. The resonance coil 11 has a floating capacitance. Therefore, the power receiving portion 27 has an electric circuit formed by the inductance of the resonance coil 11, and the capacitance of the resonance coil 11 and the capacitor 19. The capacitor 19 may also be omitted.

In the power transfer system according to this example embodiment, a difference between a natural frequency of the power transmitting portion 28 and a natural frequency of the power receiving portion 27 is equal to or less than 10% of the natural frequency of the power receiving portion 27 or the power transmitting portion 28. Setting the natural frequencies of the power transmitting portion 28 and the power receiving portion 27 within this range enables the power transfer efficiency to be increased. However, if the difference between the natural frequencies becomes greater than 10% of the natural frequency of the power receiving portion 27 or the power transmitting portion 28, it will result in adverse effects such as the power transfer efficiency dropping below 10% and the charging time of the battery 15 increasing.

Here, the natural frequency of the power transmitting portion 28 when the capacitor 25 is not provided is the oscillation frequency when an electric circuit formed by the inductance of the resonance coil 24 and the capacitance of the resonance coil 24 oscillates freely. When the capacitor 25 is provided, the natural frequency of the power transmitting portion 28 is the oscillation frequency when an electric circuit formed by the capacitance of the resonance coil 24 and the capacitor 25, and the inductance of the resonance coil 24 oscillates freely. In the electric circuit, the natural frequency when braking force and electrical resistance is zero or substantially zero may also be referred to as the resonance frequency of the power transmitting portion 28.

Similarly, the natural frequency of the power receiving portion 27 when the capacitor 19 is not provided is the oscillation frequency when an electric circuit formed by the inductance of the resonance coil 11 and the capacitance of the resonance coil 11 oscillates freely. When the capacitor 19 is provided, the natural frequency of the power receiving portion 27 is the oscillation frequency when an electric circuit formed by the capacitance of the resonance coil 11 and the capacitor 19, and the inductance of the resonance coil 11 oscillates freely. In the electric circuit, the natural frequency when braking force and electrical resistance is zero or substantially zero may also be referred to as the resonance frequency of the power receiving portion 27.

Figure 2:
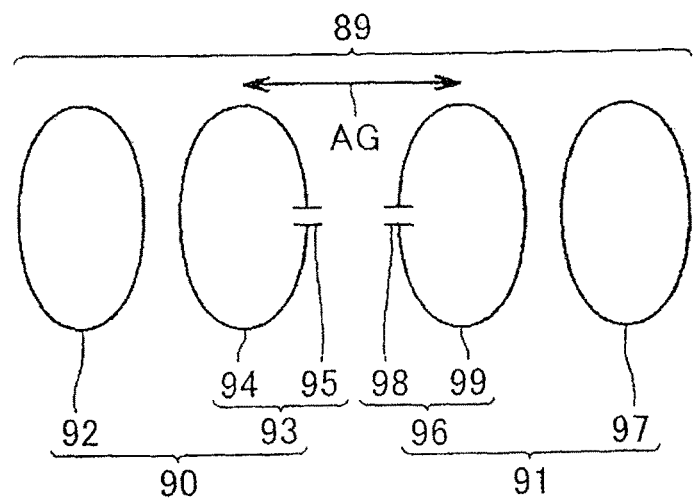
FIG. 2 is a view of a simulation model of the power transfer system.

Next, simulation results from analyzing the relationship between the power transfer efficiency and the difference between the natural frequencies will be described with reference to FIGS. 2 and 3. FIG. 2 is a view of a simulation model of a power transfer system. The power transfer system 89 includes a power transmitting apparatus 90 and a power receiving apparatus 91. The power transmitting apparatus 90 includes an electromagnetic inductive coil 92 and a power transmitting portion 93. The power transmitting portion 93 includes a resonance coil 94 and a capacitor 95. The capacitor 95 is provided with the resonance coil 94.

The power receiving apparatus 91 includes a power transmitting portion 96 and an electromagnetic inductive coil 97. The power transmitting portion 96 includes a resonance coil 99 and a capacitor 98. The capacitor 98 is connected to the resonance coil 99.

The inductance of the resonance coil 94 will be referred to as inductance Lt. The capacitance of the capacitor 95 will be referred to as capacitance C1. The inductance of the resonance coil 99 will be referred to as inductance Lr. The capacitance of the capacitor 98 will be referred to as capacitance C2. When the parameters are set in this way, the natural frequency f1 of the power transmitting portion 93 can be expressed by Expression (1) below. Also, the natural frequency f2 of the power transmitting portion 96 can be expressed by Expression (2) below.

$$f1 = 1/\{2\pi(Lt \times C1)^{1/2}\} \tag{1}$$

$$f2 = 1/\{2\pi(Lr \times C2)^{1/2}\} \tag{2}$$

Figure 3:
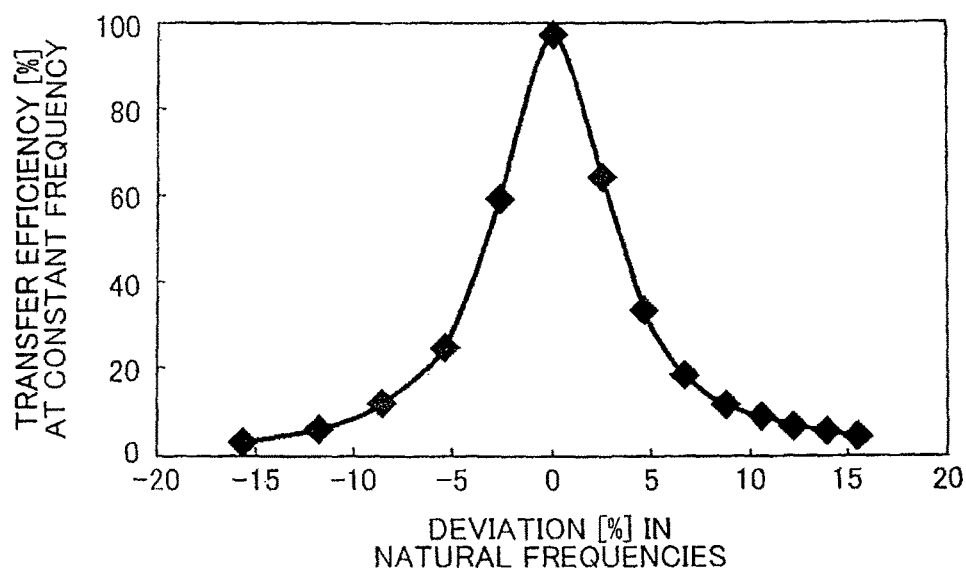
FIG. 3 is a view of the simulation results.

Here, FIG. 3 shows the relationship between the power transfer efficiency and the deviation in the natural frequencies of the power transmitting portion 93 and the power transmitting portion 96 when the inductance Lr and the capacitances C1 and C2 are fixed and only the inductance Lt is changed. In this simulation, the relative positional relationship between the resonance coil 94 and the resonance coil 99 is fixed, and the frequency of the current supplied to the power transmitting portion 93 is constant.

In the graph shown in FIG. 3, the horizontal axis represents the deviation (%) in the natural frequencies and the vertical axis represents the transfer efficiency (%) at a constant frequency. The deviation (%) in the natural frequencies can be expressed by Expression (3) below.

$$(\text{Deviation in natural frequencies}) = \{(f1 - f2)/f2\} \times 100 (\%) \tag{3}$$

As is evident from FIG. 3, when the deviation (%) in the natural frequencies is ±0%, the power transfer efficiency is close to 100%. When the deviation (%) in the natural frequencies is ±5%, the power transfer efficiency is 40%. When the deviation (%) in the natural frequencies is ±10%, the power transfer efficiency is 10%. When the deviation (%) in the natural frequencies is ±15%, the power transfer efficiency is 5%. In other words, it is evident that the power transfer efficiency is able to be increased by setting the natural frequencies of the power transmitting portion and the power receiving portion such that the absolute value of the deviation (%) in the natural frequencies (i.e., the difference between the natural frequencies) is in a range of equal to or less than 10% of the natural frequency of the power transmitting portion 96. Furthermore, it is evident that the power transfer efficiency can be further increased by setting the natural frequencies of the power transmitting portion and the power receiving portion such that the absolute value of the deviation (%) in the natural frequencies is equal to or less than 5% of the natural frequency of the power transmitting portion 96. Electromagnetic field analysis software (JMAG (registered trademark) by JSOL Corporation) was used for the simulation software.

Next, operation of the power transfer system according to the example embodiment will be described. In FIG. 1, AC current is supplied from the high frequency power driver 22 to the electromagnetic inductive coil 23. When a predetermined AC current flows to the electromagnetic inductive coil 23, AC current also flows to the resonance coil 24 by electromagnetic induction. At this time, power is supplied to the electromagnetic inductive coil 23 such that the frequency of the AC current flowing through the resonance coil 24 becomes a specific frequency.

When current of a predetermined frequency flows to the resonance coil 24, an electromagnetic field that oscillates at a specific frequency is formed around the resonance coil 24.

The resonance coil 11 is arranged within a predetermined distance from the resonance coil 24, and receives power from the electromagnetic field formed around the resonance coil 24.

In this example embodiment, a helical coil is employed for both, the resonance coil 11 and the resonance coil 24.

Therefore, a magnetic field that oscillates at a specific frequency is mainly formed around the resonance coil 24, and the resonance coil 11 receives power from this magnetic field.

Here, the magnetic field of a specific frequency that is formed around the resonance coil 24 will be described. With the magnetic field of a specific frequency, there is typically a connection between the power transfer efficiency and the frequency of the current supplied to the resonance coil 24. Therefore, first the relationship between the power transfer efficiency and the frequency of the current supplied to the resonance coil 24 will be described. The power transfer efficiency when transferring power from the resonance coil 24 to the resonance coil 11 changes due to various factors, such as the distance between the resonance coil 24 and the resonance coil 11. For example, the natural frequency (resonance frequency) of the power transmitting portion 28 and the power receiving portion 27 will be referred to as natural frequency f0, the frequency of the current supplied to the resonance coil 24 will be referred to as frequency f3, and an air gap between the resonance coil 11 and the resonance coil 24 will be referred to as air gap AG.

Figure 4:
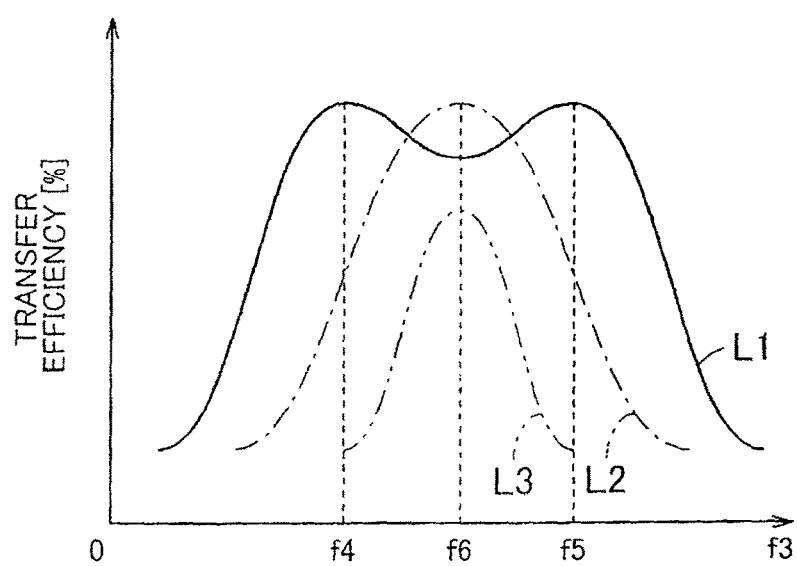
FIG. 4 is a graph showing the relationship between the power transfer efficiency when an air gap is changed, and a frequency f of current supplied to a resonance coil, while a natural frequency is fixed.

FIG. 4 is a graph showing the relationship between the power transfer efficiency when the air gap AG is changed, and the frequency f3 of the current supplied to the resonance coil 24, when the natural frequency f0 is fixed.

In the graph shown in FIG. 4, the horizontal axis represents the frequency f3 of the current supplied to the resonance coil 24, and the vertical axis represents the power transfer efficiency (%). The efficiency curve L1 shows a frame format of the relationship between the power transfer efficiency when the air gap AG is small, and the frequency f3 of the current supplied to the resonance coil 24. As shown by this efficiency curve L1, when the air gap AG is small, the peak of the power transfer efficiency occurs at frequencies f4 and f5 (f4<f5). When the air gap AG is increased, the two peaks when the power transfer efficiency increases change so as to become closer together. Also, as shown by the efficiency curve L2, when the air gap AG becomes greater than a predetermined distance, the peak of the power transfer efficiency becomes a single peak. The power transfer efficiency peaks when the frequency of the current supplied to the resonance coil 24 is a frequency f6. When the air gap AG is increased so that it is even greater than it is with the efficiency curve L2, the peak of the power transfer efficiency becomes smaller, as shown by the efficiency curve L3.

For example, a first method described below is conceivable as a method for improving the power transfer efficiency. This first method involves keeping the frequency of the current supplied to the resonance coil 24 shown in FIG. 1 constant and changing the capacitance of the capacitor 25 and the capacitor 19 to match the air gap AG. Accordingly, a method that involves changing the characteristic of the power transfer efficiency between the power transmitting portion 28 and the power receiving portion 27 is possible. More specifically, the capacitance of the capacitor 25 and the capacitor 19 is adjusted such that the power transfer efficiency peaks while the frequency of the current supplied to the resonance coil 24 is kept constant. With this method, the frequency of the current that flows to the resonance coil 24 and the resonance coil 11 is constant regardless of the size of the air gap AG. A method that involves using the matching unit provided between the power transmitting apparatus 41 and the high frequency power driver 22, or a method that involves using the DC/DC converter 14, or the like may also be employed as a method for changing the characteristic of the power transfer efficiency.

Also, a second method involves adjusting the frequency of the current supplied to the resonance coil 24 based on the size of the air gap AG. For example, when the power transfer characteristic is that of the efficiency curve L1 in FIG. 4, current in which the frequency is the frequency f4 or the frequency f5 is supplied to the resonance coil 24. Also, when the frequency characteristic is that of the efficiency curves L2 and L3, current in which the frequency is the frequency f6 is supplied to the resonance coil 24. In this case, the frequency of the current that flows to the resonance coil 24 and the resonance coil 11 is changed to match the size of the air gap AG.

In the first method, the frequency of the current that flows through the resonance coil 24 is a constant frequency that is fixed. In the second method, the frequency of the current that flows through the resonance coil 24 is a frequency that changes appropriately according to the air gap AG. Current of a specific frequency set so that the power transfer efficiency increases is supplied to the resonance coil 24 according to the first method and the second method or the like. A magnetic field (electromagnetic field) that oscillates at a specific frequency is formed around the resonance coil 24 by current of the specific frequency flowing to the resonance coil 24. The power receiving portion 27 receives power from the power transmitting portion 28 via this magnetic field. The magnetic field is formed between the power receiving portion 27 and the power transmitting portion 28, and oscillates at a specific frequency. Therefore, the magnetic field that oscillates at a specific frequency is not limited to a magnetic field of a fixed frequency. In the example described above, the frequency of the current supplied to the resonance coil 24 is set focusing on the air gap AG. However, the power transfer efficiency may also change according to other factors such as a deviation in the horizontal direction of the resonance coil 24 and the resonance coil 11, and the frequency of the current supplied to the resonance coil 24 may be adjusted based on these other factors.

In this example embodiment, an example in which a helical coil is used as the resonance coil is described. However, if an antenna such as a meander line antenna is used as the resonance coil, an electric field of a specific frequency will be formed around the resonance coil 24 by current of a specific frequency flowing to the resonance coil 24. Also, power transfer is performed between the power transmitting portion 28 and the power receiving portion 27 via this electric field.

Figure 5:
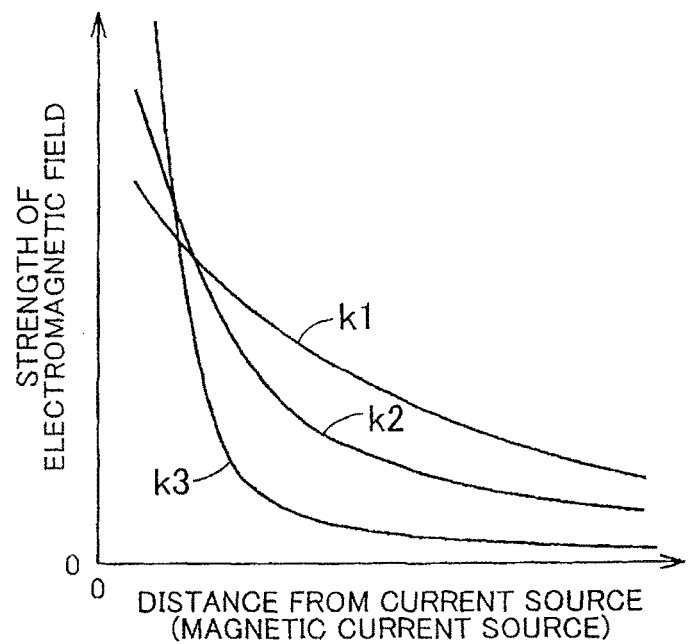
FIG. 5 is a graph showing the relationship between the distance from a current source (magnetic current source) and the strength of an electromagnetic field.

In the power transfer system according to this example embodiment, power transmitting efficiency and power receiving efficiency are improved by using a near field (evanescent field) where the static electromagnetic field of the electromagnetic field is dominant. FIG. 5 is a graph showing the relationship between the strength of the electromagnetic field and the distance from the current source or the magnetic current source. Referring to FIG. 5, the electromagnetic field is formed of three components. Curve k1 is a component that is inversely proportional to the distance from the wave source, and will be referred to as a radiated electromagnetic field. Curve k2 is a component that is inversely proportional to the square of the distance from the wave source, and will be referred to as an induction electromagnetic field. Also, curve k3 is a component that is inversely proportional to the cube of the distance from the wave source, and will be referred to as a static electromagnetic field. If the wavelength of the electromagnetic field is λ, the distance at which the strengths of the radiated electromagnetic field, the induction electromagnetic field, and the static electromagnetic field are substantially equal can be expressed as $\lambda/2\pi$.

The static electromagnetic field is a region where the strength of the electromagnetic waves sharply decreases with distance from the wave source. With the power transfer system (resonance method) according to the example embodiment, the power transfer of energy (electric power) is performed by using near-field (evanescent field) where this static electromagnetic field that is dominant. In other words, in the near filed in which the electrostatic field is dominant, the power transmitting portion 28 and the power receiving portion 27 (e.g., a pair of LC resonance coils) having the natural frequencies that are close together are resonated to transfers energy (electric power) from the power transmitting portion 28 to the other power receiving portion 27. This static electromagnetic field does not propagate energy far away, the resonance method achieves less energy loss in electric power transmission as compared with the case of an electromagnetic waves that transfer energy (electric power) using the radiated electromagnetic field, which propagates energy, far away.

In this way, in this power transfer method, power is transferred in a contactless manner between the power transmitting portion and the power receiving portion by resonating the power transmitting portion and the power receiving portion by the electromagnetic field. This electromagnetic field formed between the power receiving portion and the power transmitting portion may be referred to as a near field resonance coupling field. Also, a coupling coefficient k between the power transmitting portion and the power receiving portion is approximately equal to or less than 0.3, and preferably equal to or less than 0.1, for example. Naturally, a coupling coefficient k within a range of approximately 0.1 to 0.3 may also be used. The coupling coefficient k is not limited to such a value. That is, the coupling coefficient k may be any of a variety of values that yield good power transfer.

The coupling of the power transmitting portion 28 and the power receiving portion 27 in the power transfer in this example embodiment is referred to as magnetic resonance coupling, near field resonance coupling, electromagnetic resonance coupling, or electric field resonance coupling, for example.

Electromagnetic resonance coupling is coupling that includes both magnetic resonance coupling and electric field resonance coupling.

A coil-shaped antenna is used for both the resonance coil 24 of the power transmitting portion 28 and the resonance coil 11 of the power receiving portion 27 described in this specification, so the power transmitting portion 28 and the power receiving portion 27 are mainly coupled by a magnetic field. At this time, the power transmitting portion 28 and the power receiving portion 27 are coupled by magnetic resonance coupling.

An antenna such as a meander line antenna may be used for each of the resonance coils 24 and 11, for example. In this case, the power transmitting portion 28 and the power receiving portion 27 are mainly coupled by an electric field. At this time, the power transmitting portion 28 and the power receiving portion 27 are coupled by electric field resonance coupling.

Figure 6:
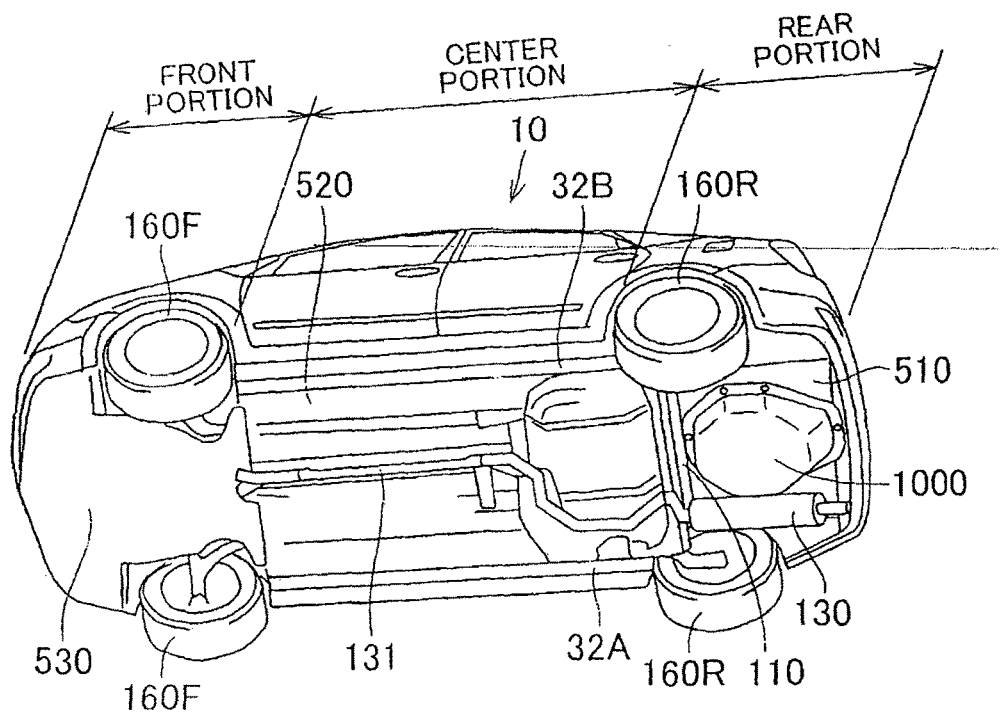
FIG. 6 is a bottom view of the vehicle in the example embodiment.
Figure 7:
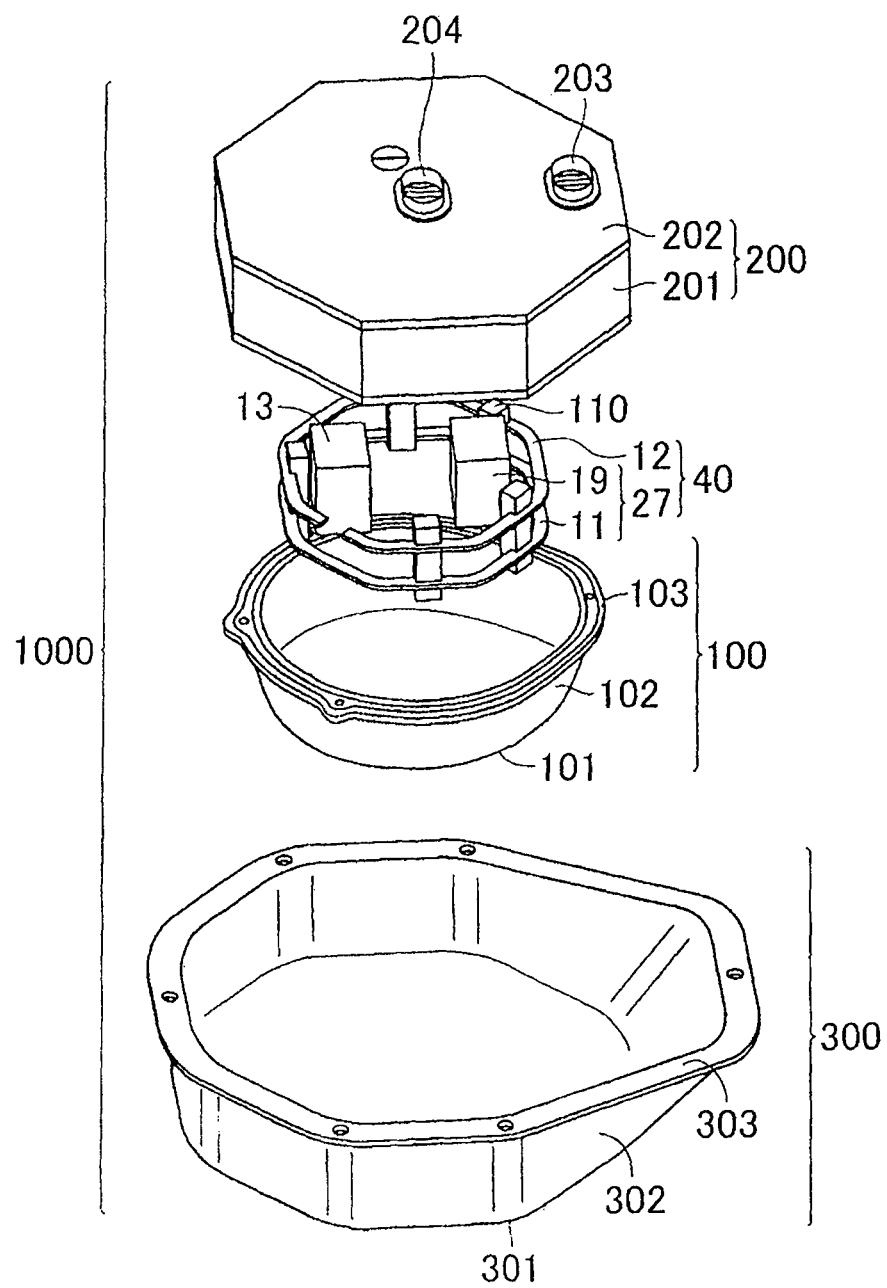
FIG. 7 is an exploded perspective view of the structure of a power receiving unit in the example embodiment.
Figure 8:
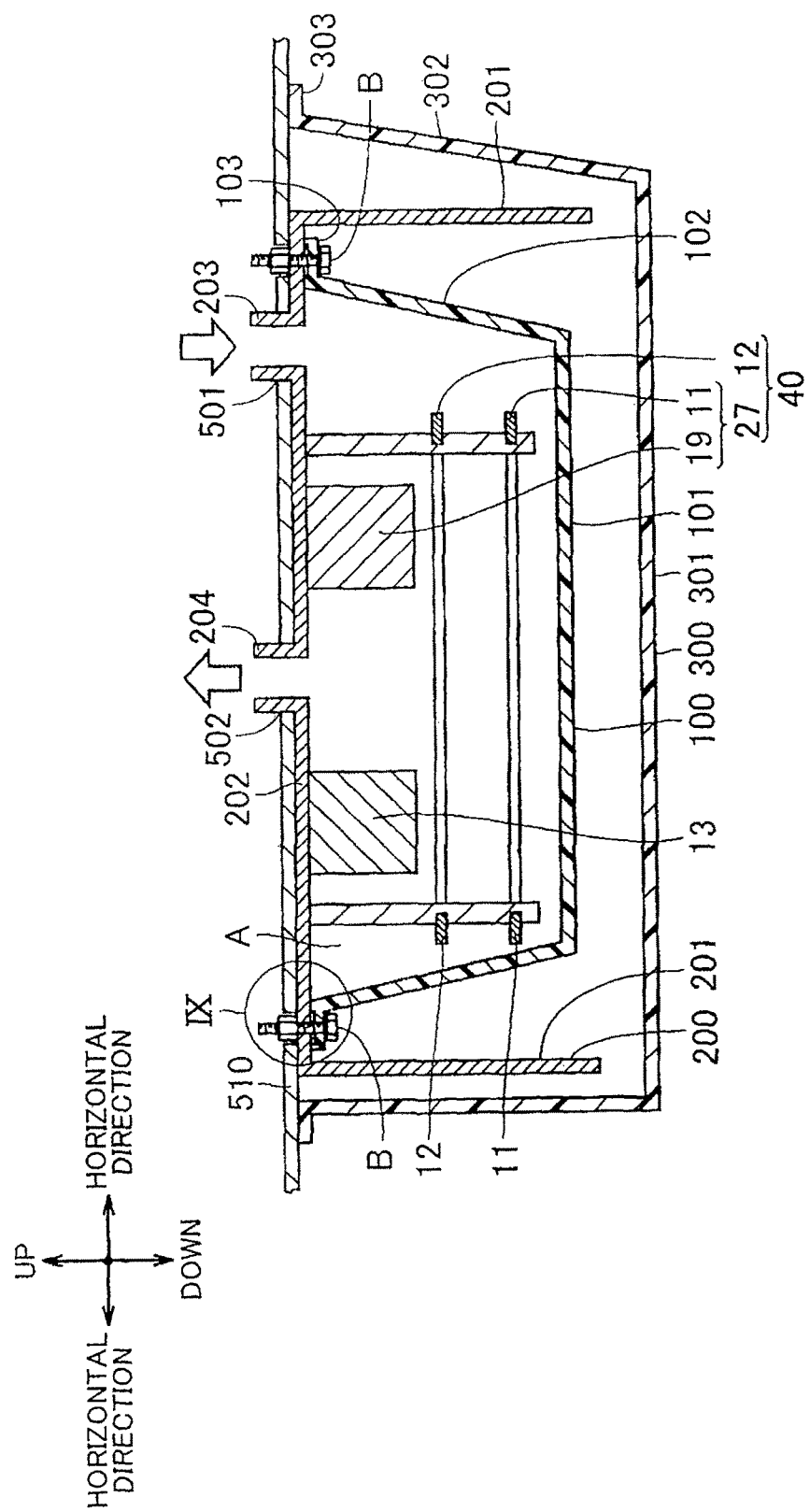
FIG. 8 is a sectional view of the power receiving unit in the example embodiment.
Figure 9:
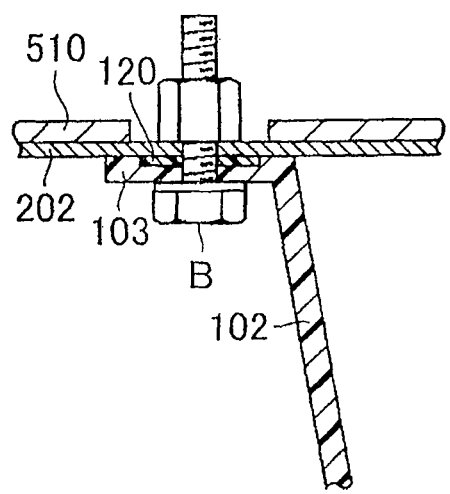
FIG. 9 is a partial enlarged sectional view of the region encircled by IX in FIG. 8.
Figure 10:
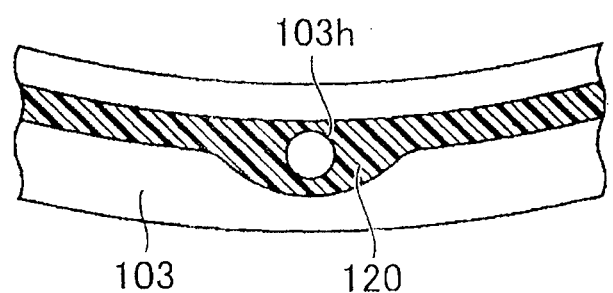
FIG. 10 is a plan view of a seal structure employed in the power receiving unit in the example embodiment.

Next, the specific structure of a power receiving, unit 1000 mounted in the electric vehicle 10 in the example embodiment will be described with reference to FIGS. 6 to 10. FIG. 6 is a bottom view of the electric vehicle 10 in the example embodiment, FIG. 7 is an exploded perspective view of the power receiving unit 1000 in the example embodiment, FIG. 8 is a sectional view of the power receiving unit 1000 in the example embodiment, FIG. 9 is a partial enlarged sectional view of the region encircled by IX in FIG. 8, and FIG. 10 is a plan view of a seal structure employed in the power receiving unit 1000 in the example embodiment.

As shown in FIG. 6, a region from a front end of the electric vehicle 10 to a rear end of a front tire 160F will be referred to as a "front portion", a region from the rear end of the front tire 160F to a front end of a rear tire 160R will be referred to as a "center portion", and a region from the front end of the rear tire 160R to a rear end of the electric vehicle 10 will be referred to as a "rear portion".

The same applies to the description below. Also, when the electric vehicle 10 is stopped on a horizontal surface (plane), upward in the vertical direction will be referred to as "upper side", "upper", or "above", and downward in the vertical direction will be referred to as "lower side", "lower", or "below". Also, the direction of the arrows pointing in a direction parallel to the horizontal surface will be referred to as "horizontal direction".

Referring to FIG. 6, in the electric vehicle 10 in this example embodiment, the power receiving unit 1000 is mounted below a rear floor panel 510 at the rear portion of the electric vehicle 10. The mounting position of the power receiving unit 1000 is not limited to being at the rear portion of the electric vehicle 10. That is, the power receiving unit 1000 may also be mounted below a center floor panel 520 of the center portion, or below an engine under floor panel 530 of the front portion.

Referring now to FIG. 7, the power receiving unit 1000 includes the power receiving apparatus 40, an electromagnetic shield 200, a power receiving portion cover 100 (a first cover), and an undercover 300 (a second cover). The power receiving unit 1000 is mounted below the rear floor panel 510 provided in the electric vehicle 10. The power receiving apparatus 40 includes the power receiving portion 27 that receives power in a contactless manner from the power transmitting portion 28 that is externally provided. The electromagnetic shield 200 prevents the electromagnetic field from passing through. The power receiving portion cover 100 covers the power receiving portion 27 and allows the electromagnetic field to pass through. The undercover 300 covers the power receiving portion cover 100 and allows the electromagnetic field to pass through.

In the example of the structure shown in FIG. 7, the electromagnetic shield 200 is open from below (i.e., on a lower side) where the power receiving portion 27 is located, and surrounds the power receiving portion 27 from above and the side in the horizontal direction, when the power receiving portion 27 is viewed from above. That is, the electromagnetic shield 200 surrounds the upper side and the side, in the horizontal direction, of the power receiving portion 27. The power receiving portion cover 100 is provided covering the power receiving portion 27, in a position below the power receiving portion 27. The undercover 300 is provided covering the power receiving portion cover 100, in a position below the power receiving portion cover 100.

The power receiving apparatus 40 includes the power receiving portion 27 and the electromagnetic inductive coil 12 that is octagonal. The power receiving portion 27 includes the resonance coil 11 that is octagonal and the capacitor 19. The resonance coil 11 and the electromagnetic inductive coil 12 are fixed to the electromagnetic shield 200 using a resin support member 110.

The shapes of the resonance coil 11 and the electromagnetic inductive coil 12 are not limited to being octagonal. Alternatively, they may be circular, square, rectangular, or another shape. Similarly, the shape of the electromagnetic shield 200 is not limited to the shape shown in the drawing.

Also, the positional relationship of the resonance coil 11 and the electromagnetic inductive coil 12 shown in the drawing is one in which the resonance coil 11 and the electromagnetic inductive coil 12 are stacked in the vertical direction, but the positional relationship of these is not limited to this. That is, a structure in which the electromagnetic inductive coil 12 is arranged to the outside of the resonance coil 11 in the radial direction of the coil may be employed, or a structure in which the resonance coil 11 is arranged to the outside of the electromagnetic inductive coil 12 may be employed. Also, a structure in which the electromagnetic inductive coil 12 is not provided may also be employed.

In this example embodiment, the rectifier 13 and the capacitor 19 are arranged to the inside of the resonance coil 11 and the electromagnetic inductive coil 12. The positional relationship of the rectifier 13 and the DC/DC capacitor 19 is not limited to this, however.

Next, the specific shapes of the electromagnetic shield 200, the power receiving portion cover 100, and the undercover 300 will be described with reference to both FIG. 7 and FIG. 8, but mainly FIG. 8.

The electromagnetic shield 200 includes a base portion 202 and a side wall portion 201. The base portion 202 is positioned on the rear floor panel 510 side, which is the upper side when viewed from the resonance coil 11. The side wall portion 201 surrounds the resonance coil 11 from the side in the horizontal direction when viewed from the resonance coil 11, and surrounds the base portion 202 at an edge portion of the base portion 202, and extends downward from the base portion 202.

The rectifier 13 and the capacitor 19 are fixed to the base portion 202. Also, the resonance coil 11 and the electromagnetic inductive coil 12 are fixed to the base portion 202 using the support member 110. An inlet 203 for taking in cooling air and an outlet 204 for discharging cooling air are provided in the base portion 202.

An inlet opening 501 and an outlet opening 502 are provided beforehand in the rear floor panel 510. The inlet 203 protrudes from the inlet opening 501, and the outlet 204 protrudes from the outlet opening 502. A cooling system, not shown, that is mounted in the electric vehicle 10 is connected to the inlet 203 and the outlet 204.

The electromagnetic shield 200 surrounds the power receiving portion 27 from above and the side in the horizontal direction, when viewed from the power receiving portion 27. The electromagnetic shield 200 is made of metal material such as steel, aluminum, or copper in order to prevent the electromagnetic field from passing through. When the electromagnetic field reaches the electromagnetic shield 200, the electromagnetic field is converted into an eddy current, so an electromagnetic shielding effect is displayed. In order to efficiently convert the electromagnetic waves that have reached the electromagnetic shield 200 into an eddy current and improve the shielding effect, the electromagnetic shield 200 is preferably made of material having low impedance. That is, the electromagnetic shield 200 is preferably made of copper.

A shielding process may also be applied to the surface of the material to give the material a shielding effect. Examples of such a shielding process include a plating process, an application process, and a thin film adhesion process and the like.

The power receiving portion cover 100 is fixed to the electromagnetic shield 200 so as to cover the resonance coil 11. More specifically, the power receiving portion cover 100 has a bottom portion 101, a side wall portion 102, and a flange portion 103. The bottom portion 101 is positioned below the resonance coil 11. The side wall portion 102 surrounds the bottom portion 101 at an edge portion of the bottom portion 101 and extends upward from the bottom portion 101. The flange portion 103 extends toward the outside that is the side opposite the resonance coil 11, at an upper end of the side wall portion 102.

In this example embodiment, the side wall portion 102 and the flange portion 103 are positioned to the inside, i.e., the resonance coil 11 side, of the side wall portion 201 of the electromagnetic shield 200 so as to cover the resonance coil 11. Also, the flange portion 103 is fixed to the base portion 202 of the electromagnetic shield 200 using bolts B.

Referring now to FIGS. 9 and 10, bolt holes 103h are provided in the flange portion 103 at predetermined intervals. Also, a seal member 120 is arranged on the flange portion 103. This seal member 120 is used so that there will not be a gap between the flange portion 103 and the base portion 202 when bolting the flange portion 103 to the base portion 202. Some examples of the material of which this seal member 120 is formed include flexible resin material and elastic rubber material.

Interposing this seal member 120 between the flange portion 103 and the base portion 202 make it possible to inhibit gas and liquid from getting in from the outside. Also, the resonance coil 11, the electromagnetic inductive coil 12, the rectifier 13, and the capacitor 19 are able to be housed in a highly airtight space A by the power receiving portion cover 100 and the electromagnetic shield 200. Moreover, the cooling effect using the inlet 203 and the outlet 204 is also able to be increased.

The power receiving portion cover 100 may be made of resin material because it is all right to allow the electromagnetic field to pass through. Therefore, the power receiving portion cover 100 may be integrally formed by a molded article made of resin material. As a result, the degree of freedom in design, such as the shape, of the power receiving portion cover 100 is able to be increased.

The power receiving portion cover 100 is positioned inside the undercover 300 that will be described later. The resonance coil 11, the electromagnetic inductive coil 12, the rectifier 13, and the capacitor 19 are thus doubly covered by the power receiving portion cover 100 and the undercover 300. Therefore, liquid and gas are able to be more reliably inhibited from getting into the power receiving portion cover 100 from the outside, even if the seal member 120 is not provided on the undercover 300. Accordingly, it can be expected that even better performance in terms of inhibiting gas and liquid from getting in from the outside will be obtained by providing the seal member 120.

Referring back to FIG. 8 again, the undercover 300 is fixed to the rear floor panel 510 so as to cover the electromagnetic shield 200 and the power receiving portion cover 100. More specifically, the undercover 300 includes an outermost bottom portion 301, an outermost side wall portion 302, and an outermost flange portion 303. The outermost bottom portion 301 is positioned below the bottom portion 101 of the power receiving portion cover 100. The outermost side wall portion 302 surrounds the outermost bottom portion 301 at an edge portion of the outermost bottom portion 301, and extends upward from the outermost bottom portion 301. The outermost flange portion 303 extends toward the outside that is the side opposite the resonance coil 11, at an upper end of the outermost side wall portion 302.

In this example embodiment, although not shown, the outermost flange portion 303 of the outermost side wall portion 302 is fixed to the rear floor panel 510 using bolts or the like. A molded article made of resin material may be used for the undercover 300, because it is all right to allow the electromagnetic field to pass through.

The resonance coil 11, the electromagnetic inductive coil 12, the rectifier 13, and the capacitor 19 can be expected to be waterproof and airtight by the power receiving portion cover 100 that is positioned to the inside of the undercover 300. Therefore, the undercover 300 may function to prevent those components, i.e., the resonance coil 11, the electromagnetic inductive coil 12, the rectifier 13, and the capacitor 19, from deforming when subjected to a high pressure car wash, and from being damaged as a result of being struck by flying stones, and in addition, may have an exterior design function, unlike the power receiving portion cover 100.

Also, using the bolts B to attach the power receiving portion cover 100 and the undercover 300 facilitates the work of attaching and detaching the power receiving portion cover 100 and the undercover 300. As a result, even after the power receiving portion cover 100 and the undercover 300 have been attached, they (i.e., the power receiving portion cover 100 and the undercover 300) can easily be removed, which makes it easy to adjust the resonance coil 11 and the electromagnetic inductive coil 12 and the like.

In this, way, the example embodiment makes it possible to provide the electric vehicle 10 that has a specific structure for protecting the power receiving portion 27, i.e., has the structure that includes the electromagnetic shield 200 that prevents the electromagnetic field from passing through, the power receiving portion cover 100 that allows the magnetic field to pass through and is positioned below the power receiving portion 27 that includes the resonance coil 11, and covers the power receiving portion 27, and the undercover 300 that allows the electromagnetic field to pass through and is positioned below the power receiving portion cover 100, and covers the power receiving portion cover 100.

In the example embodiment described above, a structure in which the base portion 202 of the electromagnetic shield 200 directly contacts the lower surface of the rear floor panel 510 is employed, but the invention is not limited to this structure. For example, as shown in FIG. 11, a structure in which a space S is provided between the lower surface of the rear floor panel 510 and the upper surface of the base portion 202 of the electromagnetic shield 200 may also be employed.

Figure 11:
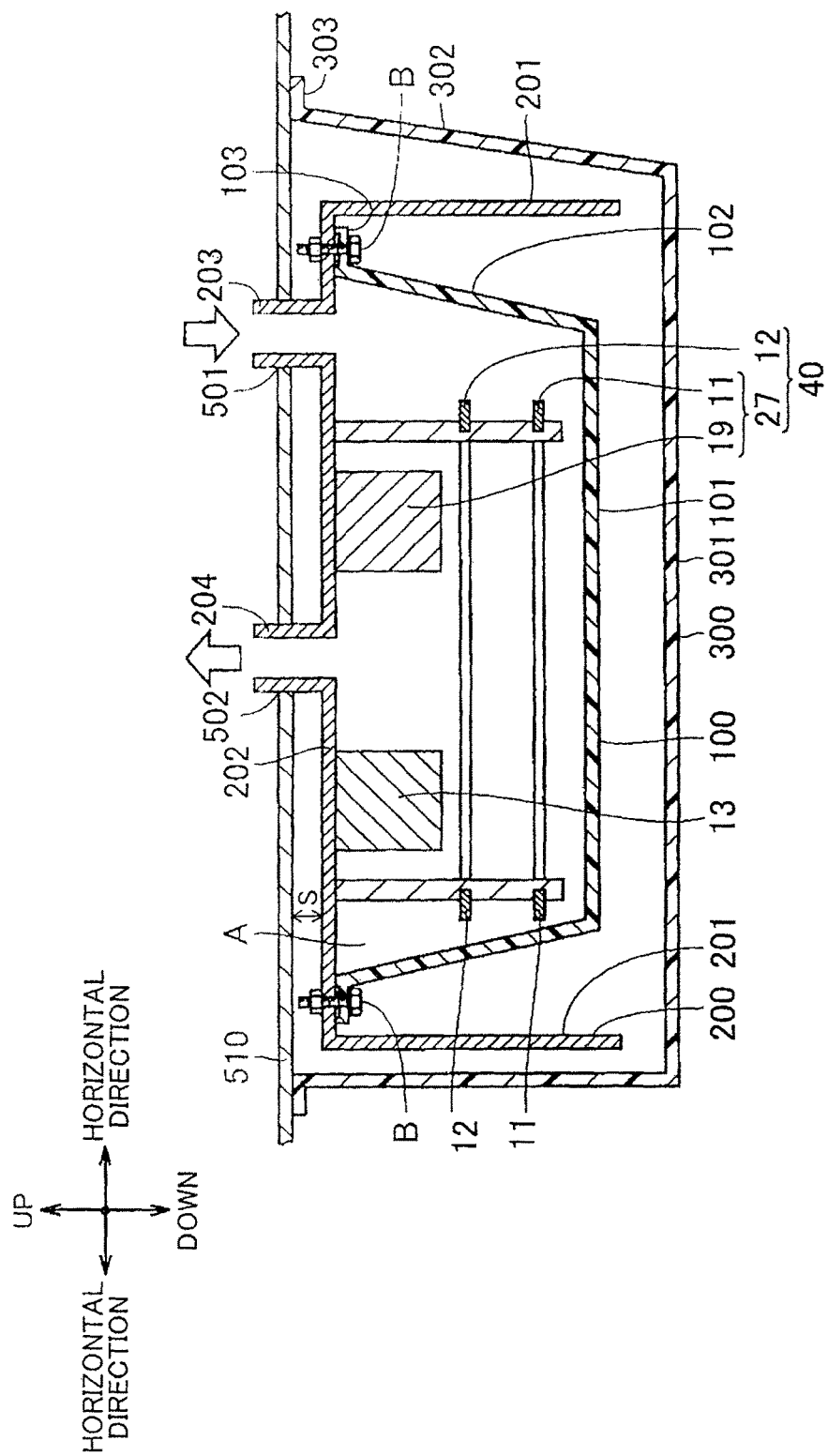
FIG. 11 is a sectional view of another structure of the power receiving unit in the example embodiment.
Figure 12:
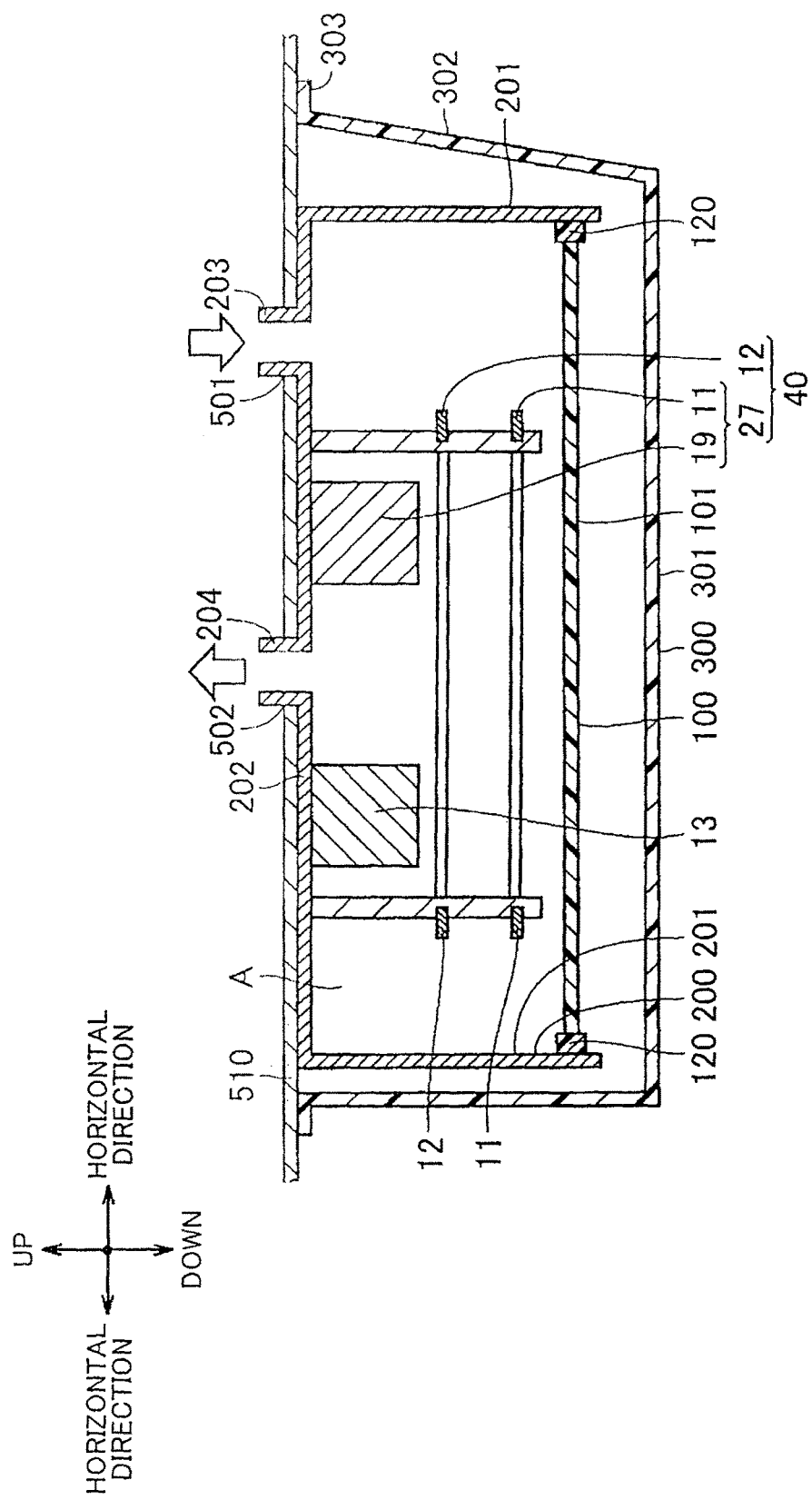
FIG. 12 is a sectional view of a power receiving unit according to another example embodiment.

Also, the structures of the power receiving portion cover 100 shown in FIGS. 8 and 11 are structures in which the side wall portion 102 and the flange portion 103 are provided, but the invention is not limited to this. For example, as shown in FIG. 12, a structure in which the power receiving portion cover 100 formed only of the bottom portion 101 is used, and an outer peripheral edge portion of the bottom portion 101 is fixed to the side wall portion 201 of the electromagnetic shield 200 via the seal member 120, may be employed.

Figure 13:
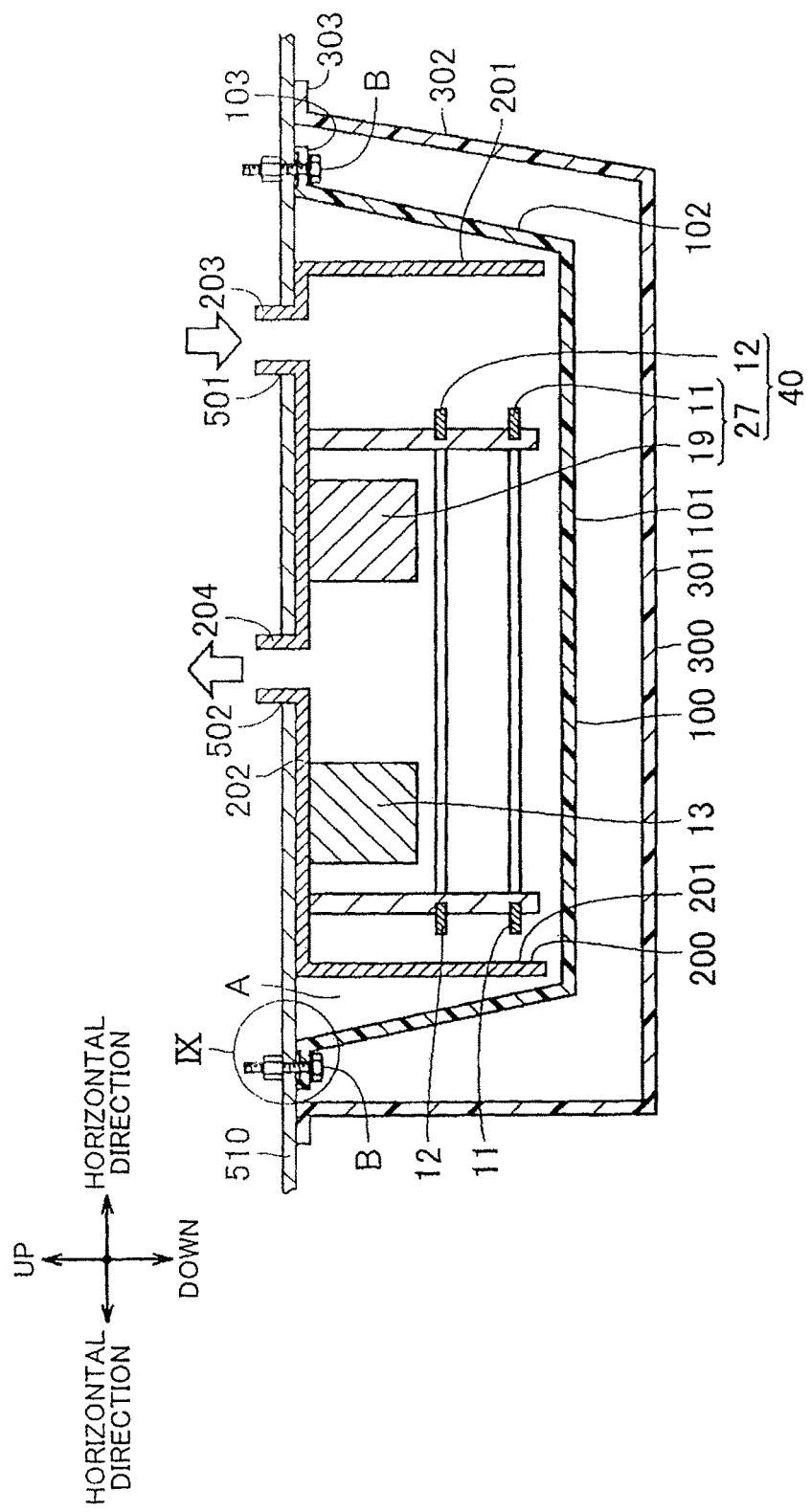
FIG. 13 is a sectional view of a power receiving unit according to yet another example embodiment.

Furthermore, as another structure, as shown in FIG. 13, a structure may be employed in which the side wall portion 102 of the power receiving portion cover 100 is fixed to the rear floor panel 510 at an outer position at a side opposite, with respect to the side wall portion 201 of the electromagnetic shield 200, to the power receiving portion 27, such that the side wall portion 201 is sandwiched between the power receiving portion 27 and the side wall portion 102.

Also, in the example embodiment described above, a case is described in which the base portion 202 is provided on the electromagnetic shield 200. Alternatively, however, a structure may be employed in which the rear floor panel 510 is used as the base portion 202, and the side wall portion 201 that extends downward from the rear floor panel 510 is provided on the rear floor panel 510.

The example embodiments disclosed herein are in all respects merely examples and are not limiting. The scope of the invention is indicated not by the foregoing description but by the scope of the claims for patent, and includes all modifications that are within the scope and meanings equivalent to the scope of the claims for patent.

The invention claimed is:

1. A vehicle comprising:
a power receiving portion that receives electric power in a contactless manner from a power transmitting portion provided outside the vehicle;
an electromagnetic shield that prevents an electromagnetic field from passing through;
a first cover that allows the electromagnetic field to pass through and covers the power receiving portion; and
a second cover that (1) allows the electromagnetic field to pass through, (2) covers the first cover, and (3) horizontally surrounds the electromagnetic shield,
wherein the second cover has a base portion and a wall portion that constitute a housing with an opening on an upper side of the housing, the opening opposing the base portion, and the wall portion horizontally surrounds the electromagnetic shield;
the power receiving portion is mounted below a floor panel provided in the vehicle;
the electromagnetic shield is open on a lower side where the power receiving portion is located, and surrounds the power receiving portion from above and a side in a horizontal direction; the first cover is positioned below the power receiving portion and covers the power receiving portion; and the second cover is positioned below the first cover and covers the first cover;
the electromagnetic shield includes a base portion positioned on the floor panel side, and a side wall portion that surrounds the base portion at an edge portion of the base portion, and extends downward from the base portion; and
the first cover is fixed to the floor panel at a position on an opposite side of the side wall portion of the electromagnetic shield from the power receiving portion so that the first cover covers the power receiving portion; and the second cover is fixed to the floor panel so as to cover the electromagnetic shield.

2. The vehicle according to claim 1, wherein the electromagnetic shield is provided at a position on an opposite side of the power receiving portion from the power transmitting portion side.

3. The vehicle according to claim 1, wherein the electromagnetic shield includes a base portion positioned on the floor panel side, and a side wall portion that surrounds the base portion at an edge portion of the base portion, and extends downward from the base portion;
the first cover is fixed to the electromagnetic shield so as to cover the power receiving portion; and
the second cover is fixed to the floor panel so as to cover the electromagnetic shield.

4. The vehicle according to claim 3, wherein
the first cover is fixed to the base portion, in a position at an inside, which is the power receiving portion side, of the side wall portion of the electromagnetic shield, so as to cover the power receiving portion.

5. The vehicle according to claim 3, wherein
the first cover is fixed to the side wall portion of the electromagnetic shield.

6. The vehicle according to claim 1, wherein
the first cover is fixed to the electromagnetic shield with a seal member disposed between the first cover and the electromagnetic shield.

7. The vehicle according to claim 1, wherein
the first cover is fixed to the floor panel with a seal member disposed between the first cover and the floor panel.

8. The vehicle according to claim 1, wherein
a difference between a natural frequency of the power transmitting portion and a natural frequency of the power receiving portion is equal to or less than 10% of the natural frequency of the power receiving portion.

9. The vehicle according to claim 1, wherein
a coupling coefficient of the power receiving portion and the power transmitting portion is equal to or less than 0.1.

10. The vehicle according to claim 1, wherein
the power receiving portion receives electric power from the power transmitting portion through at least one of a magnetic field that is formed between the power receiving portion and the power transmitting portion and that oscillates at a specific frequency, and an electric field that is formed between the power receiving portion and the power transmitting portion and that oscillates at a specific frequency.

11. A vehicle comprising:
a power receiving portion that receives electric power in a contactless manner from a power transmitting portion provided outside the vehicle;
an electromagnetic shield that prevents an electromagnetic field from passing through;
a first cover that allows the electromagnetic field to pass through and covers the power receiving portion; and
a second cover that (1) allows the electromagnetic field to pass through, (2) covers the first cover, and (3) horizontally surrounds the electromagnetic shield,
wherein
the power receiving portion is mounted below a floor panel provided in the vehicle,
the electromagnetic shield is open on a lower side where the power receiving portion is located, and surrounds the power receiving portion from above and a side in a horizontal direction; the first cover is positioned below the power receiving portion and covers the power receiving portion; and the second cover is positioned below the first cover and covers the first cover,
the electromagnetic shield includes a base portion positioned on the floor panel side, and a side wall portion that surrounds the base portion at an edge portion of the base portion, and extends downward from the base portion;
the first cover is fixed to the electromagnetic shield so as to cover the power receiving portion; and
the second cover is fixed to the floor panel so as to cover the electromagnetic shield.

12. The vehicle according to claim 11, wherein
the first cover is fixed to the base portion, in a position at an inside, which is the power receiving portion side, of the side wall portion of the electromagnetic shield, so as to cover the power receiving portion.

13. The vehicle according to claim 11, wherein
the first cover is fixed to the side wall portion of the electromagnetic shield.

* * * * *